(12) United States Patent
Sharifi et al.

(10) Patent No.: US 8,592,983 B2
(45) Date of Patent: Nov. 26, 2013

(54) METHOD OF INTEGRATING A PLURALITY OF BENZOCYCLOBUTENE LAYERS WITH A SUBSTRATE AND AN ASSOCIATED DEVICE

(75) Inventors: Hasan Sharifi, Agoura Hills, CA (US); Alexandros D. Margomenos, Pasadena, CA (US); Ara K. Kurdoghlian, La Canada, CA (US); Miroslav Micovic, Thousand Oaks, CA (US); Keisuke Shinohara, Thousand Oaks, CA (US); Colleen M. Butler, Camarillo, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 13/310,074

(22) Filed: Dec. 2, 2011

(65) Prior Publication Data

US 2013/0140579 A1  Jun. 6, 2013

(51) Int. Cl.
*H01L 23/532* (2006.01)
*H01L 51/40* (2006.01)

(52) U.S. Cl.
USPC ............ 257/759; 257/E23.001; 257/E23.142; 438/99

(58) Field of Classification Search
CPC ............ H01L 23/5329; H01L 23/5222; H01L 21/02126; H01L 51/0545; H01L 51/0036
USPC ............ 257/76, 678, 773, E23.001, E23.142, 257/734, 758, 759; 438/6, 128, 598, 618, 438/622, 637, 99
See application file for complete search history.

(56) References Cited

U.S. PATENT DOCUMENTS

| | | | |
|---|---|---|---|
| 7,772,682 B1 | 8/2010 | Zhang et al. | |
| 2003/0122244 A1* | 7/2003 | Lin et al. | 257/700 |
| 2003/0170950 A1* | 9/2003 | LaFleur | 438/240 |
| 2004/0195582 A1 | 10/2004 | Tomita et al. | |
| 2005/0070086 A1 | 3/2005 | Isono | |

(Continued)

FOREIGN PATENT DOCUMENTS

| | | |
|---|---|---|
| DE | 10 2008 04210 | 3/2010 |
| JP | 2010-16093 A | 1/2010 |

OTHER PUBLICATIONS

International Search Report and Written Opinion for Application No. PCT/US2012/053031 dated Dec. 3, 2012.

(Continued)

*Primary Examiner* — Nikolay Yushin
(74) *Attorney, Agent, or Firm* — Alston & Bird LLP

(57) ABSTRACT

A method of integrating benzocyclobutene (BCB) layers with a substrate is provided along with a corresponding device. A method includes forming a first BCB layer on the substrate and depositing a first metal layer on the first BCB layer and within vias defined by the first metal layer. The method also forms a second BCB layer on the first metal layer and deposits a second metal layer on the second BCB layer and within vias defined by the second metal layer. The second metal layer extends through the vias defined by the second metal layer to establish an operable connection with the first metal layer. The first and second metal layers are independent of an electrical connection to any circuit element carried by the substrate, but the first and second metal layers secure the second BCB layer to the underlying structure and reduce the likelihood of delamination.

20 Claims, 5 Drawing Sheets

(56) References Cited

U.S. PATENT DOCUMENTS

| | | | |
|---|---|---|---|
| 2005/0167824 A1 | 8/2005 | Zhang et al. | |
| 2006/0226415 A1* | 10/2006 | Nishijima et al. | 257/11 |
| 2009/0224391 A1* | 9/2009 | Lin et al. | 257/690 |
| 2010/0025824 A1* | 2/2010 | Chen et al. | 257/620 |
| 2010/0109128 A1 | 5/2010 | West et al. | |
| 2011/0266681 A1 | 11/2011 | Fix et al. | |

OTHER PUBLICATIONS

Chanchani, R. et al., *Development and RF Characterization of High Density Integrated Substrate Technology*, IEEE Tran. On Comp. and Pack. Tech., vol. 30, No. 3, (Sep. 2007) 478-485.

Ghalichechian, N. et al., *Integration of Benzocyclobutene Polymers and Silicon Micromachined Structures Using Anisotropic Wet Etching*, J. Vac. Sci. Tech. B 22(5) (2004) 2439-2447.

Lee, J-B et al., *Planarization Techniques for Vertically Integrated Metallic MEMS on Silicon Foundry Circuits*, J. Micromech. Microeng. vol. 7, (1997) 44-54.

Patterson, P. et al., *Integration of Compound Semiconductor Devices and CMOS (CoSMOS) with Die to Wafer Bonding*, ECD Trans., vol. 16, No. 8, (2008) 221-225.

Wang, W. et al., *Low-K BCB Passivation on AlGaN—GaN HEMT Fabrication*, IEEE Electron Device Letters, vol. 25, No. 12, Dec. 2004, pp. 763-765.

*CYCLOTENE Advanced Electronic Resins*, Processing Procedures for BCB Adhesion, DOW, Jun. 2007, pp. 1-10.

* cited by examiner

METHOD OF INTEGRATING A PLURALITY OF BENZOCYCLOBUTENE LAYERS WITH A SUBSTRATE AND AN ASSOCIATED DEVICE

TECHNOLOGICAL FIELD

Example embodiments of the present disclosure relate generally to the fabrication of electronic devices and, more particularly, to a method of integrating a plurality of benzocyclobutene layers with a substrate and an associated device.

BACKGROUND

Multilayer interconnect structures have been developed for dense electronic packaging assemblies. A multilayer interconnect structure generally includes a plurality of metal layers that define the interconnects including, for example, both vertical and horizontal interconnects, and a plurality of dielectric layers that separate the metal layers. For high frequency applications, such as for monolithic microwave integrated circuit (MMIC) devices, the dielectric layers may be formed of an organic polymer, as opposed to an inorganic polymer, since a dielectric layer formed of an organic polymer creates less loss at the higher frequencies.

One organic polymer that may be utilized as a dielectric layer between the metal layers of a multilayer interconnect structure is benzocyclobutene (BCB). In this regard, BCB has a relatively low dielectric constant of 2.65 and a relatively low loss tangent of 0.0001 for signals in the microwave region. As such, a multilayer interconnect structure having BCB dielectric layers may have less parasitic capacitance between both the horizontal and vertical interconnects a high frequencies, such as frequencies in the microwave and millimeter wave ranges than multilayer interconnect structures utilizing other types of dielectric layers.

At least some electronic devices that are configured for operation at relatively high frequencies may include a semiconductor layer comprised, for example, of a III-V material, such as gallium nitride (GaN), formed on an underlying substrate, such as a silicon carbide (SiC) substrate. The semiconductor layer may define a plurality of transistors that define the functionality of the electronic device. The multilayer interconnect structure may then be formed on the semiconductor layer. However, BCB has relatively poor adhesion with III-V materials, such as GaN. In this regard, BCB has a relatively large mismatch in the coefficient of thermal expansion with respect to GaN and other III-IV materials.

BCB may also have poor adhesion to the metal interconnects of a multilayer interconnect structure. In this regard, for devices configured to operate at high frequencies, the metal interconnects may be formed of gold since gold has a relatively low resistive loss at high frequencies. However, BCB also has a relatively poor adhesion with respect to gold interconnects.

Adhesion promoters, such as AP3000 developed by The Dow Chemical Company, may be utilized to facilitate adhesion between BCB and a GaN layer. However, adhesion promoters do not increase the adhesion between BCB and the gold interconnects and, as a result, multilayer interconnect structures utilizing BCB to form the dielectric layers may still suffer from poor adhesion.

Poor adhesion of the BCB dielectric layers may manifest itself in delamination of the BCB dielectric layers. In this regard, the manufacturing process of an electronic device having a multilayer interconnect structure that includes BCB dielectric layers may include the exposure of the electronic device to various solvents, such as during an acid wash. As a result of the poor adhesion between the BCB layers and the gold interconnects and solvent may migrate, as a result of capillary action, between the BCB layers and the gold interconnects and, in some instances, between the BCB layer and the GaN layer, thereby creating delamination of the BCB layers. Such delamination may cause the electronic device to be unacceptable such that the electronic device must be scrapped. As the delamination may not occur until toward the end of the manufacturing process during the exposure of the electronic device to various solvents, delaminations may be particularly costly, as the electronic device has already been subjected to the majority, if not all, of the manufacturing processes prior to the occurrence of the delaminations.

BRIEF SUMMARY

A method of integrating a plurality of benzocyclobutene (BCB) layers with a substrate is provided along with a corresponding device. By integrating the plurality of BCB layers with the substrate, the method may reduce the likelihood of delamination between the BCB layers and various metal layers, such as the metal interconnects of a multilayer interconnect structure, as well as between a BCB layer and the substrate. By reducing the likelihood of delamination, the method of one embodiment may correspondingly increase the likelihood of successful fabrication of an acceptable device having a multilayer interconnect structure including BCB dielectric layers. As a result, devices, such as MMIC devices, having a multilayer interconnect structures with BCB dielectric layers may be more consistently and successfully fabricated including, for example, electronic devices designed for high frequency applications.

In one embodiment, a method of integrating a plurality of BCB layers with a substrate is provided that includes forming a first BCB layer on the substrate. The first BCB layer defines a plurality of vias therethrough. The method also deposits a first metal layer on the first BCB layer and within the plurality of vias defined by the first metal layer. The method also forms a second BCB layer on the first metal layer. The second BCB layer also defines a plurality of vias therethrough. The method of this embodiment additionally deposits a second metal layer on the second BCB layer and within the plurality of vias defined by the second metal layer. As such, the second metal layer extends through the vias defined by the second metal layer to establish an operable connection with the first metal layer. As a result of the operable connection between the metal layers, the second BCB layer is effectively secured to the underlying structure so as to reduce the likelihood of delamination. The first and second metal layers of this embodiment are independent of an electrical connection to any circuit element carried by the substrate.

The method of one embodiment may also include providing the substrate having a layer of gallium nitride (GaN) thereon. In this embodiment, the method may also deposit a layer of metal on the GaN layer. As such, the first BCB layer may be formed on the layer of metal. In this regard, the deposition of the first metal layer may include the establishment of an operable connection with the layer of metal, thereby effectively securing the first BCB layer to the underlying structure.

The method of one embodiment may also include the depositing a metal adhesion layer on the first metal layer prior to forming the second BCB layer. The method of one embodiment may also form the first and second BCB layers and deposit the first and second metal layers proximate an edge of a die. The method of one embodiment may also include forming a metallic interconnect concurrent with formation of at least one of the first metal layer and the second metal layer. In this regard, the metallic interconnect is configured to establish an electrical connect with a circuit element carried by the substrate but is independent of an electrical connection with the first and second metal layers. The method of one embodiment may form the second BCB layer by defining the vias through the second BCB layer to be offset in the vias of the first BCB layer.

In another embodiment, a method of integrating a plurality of BCB layers with a substrate is provided that includes providing the substrate having a layer of gallium nitride (GaN) thereon. The method also forms a first BCB layer on the GaN layer. The first BCB layer defines a plurality of vias therethrough. The method also deposits a first metal layer on the first BCB layer and within the plurality of vias defined by the first metal layer. The method also deposits a metal adhesion layer on the first metal layer and then forms the second BCB layer on the metal adhesion layer. The second BCB layer defines a plurality of vias therethrough. The method also deposits a second metal layer on the second BCB layer and within the plurality of vias defined by the second metal layer. The first and second metal layers of this embodiment are independent of an electrical connection to any circuit element carried by the substrate.

The method of one embodiment may also include depositing a layer of metal on the GaN layer. In this embodiment, the formation of the first BCB layer may include forming the first BCB layer on the layer of metal. As such, the deposition of the first metal layer may include the establishment of an operable connection with the layer of metal. In one embodiment, the deposition of the first metal layer may include depositing a first metal layer formed of gold. In one embodiment, the first and second BCB layers may be formed, and the first and second metal layers may be deposited proximate an edge of a die. In one embodiment, the method may also include forming a metallic interconnect concurrent with formation of at least one of the first metal layer and the second metal layer. In this regard, the metallic interconnect is configured to establish an electrical connect with a circuit element carried by the substrate but is independent of an electrical connection with the first and second metal layers. In one embodiment, the formation of the second BCB layer may include defining the vias through the second BCB layer to be offset from the vias of the first BCB layer.

In a further embodiment, a device is provided that includes a substrate and a plurality of BCB layers including a first BCB layer on the substrate. The first BCB layer may define a plurality of vias therethrough. The device also includes a first metal layer on the first BCB layer and within the plurality of vias defined by the first metal layer. The plurality of BCB layers also include a second BCB layer on the first metal layer. The second BCB layer defines a plurality of vias therethrough. The device of this embodiment also includes a second metal layer on the second BCB layer within the plurality of vias defined by the second metal layer. As such, the second metal layer extends through the vias defined by the second metal layer to establish an operable connection with the first metal layer, thereby effectively securing the second BCB layer to the underlying structure and reducing the likelihood of delamination of the second BCB layer. The first and second metal layers of this embodiment are independent of an electrical connection to any circuit element carried by the substrate.

The device of one embodiment also includes a layer of gallium nitride (GaN) on the substrate. In this embodiment, the first BCB layer is on the GaN layer. The device of this embodiment may also include a layer of metal on the GaN layer. As such, the first BCB layer of this embodiment is on the layer of metal. Additionally, the first metal layer of this embodiment establishes an operable connection with the layer of the metal, thereby effectively securing the first BCB layer to the underlying structure so as to reduce the likelihood of delamination of the first BCB layer. The device of one embodiment may also include a metal adhesion layer on the first metal layer. Thus, the second BCB layer of this embodiment may be on the metal adhesion layer. The device of one embodiment may comprise a die with the first and second BCB layers and the first and second metal layers being proximate an edge of the die. In one embodiment, the device may also include a metallic interconnect formed concurrent with at least one of the first metal layer and the second metal layer. In this regard, the metallic interconnect is configured to establish an electrical connect with a circuit element carried by the substrate, but is independent of an electrical connection with the first and second BCB layers.

The features, functions and advantages that have been discussed can be achieved independently in various embodiments of the present disclosure or may be combined in yet other embodiments, further details of which can be seen with reference to the following description and drawings.

BRIEF DESCRIPTION OF THE DRAWINGS

Figure 1:
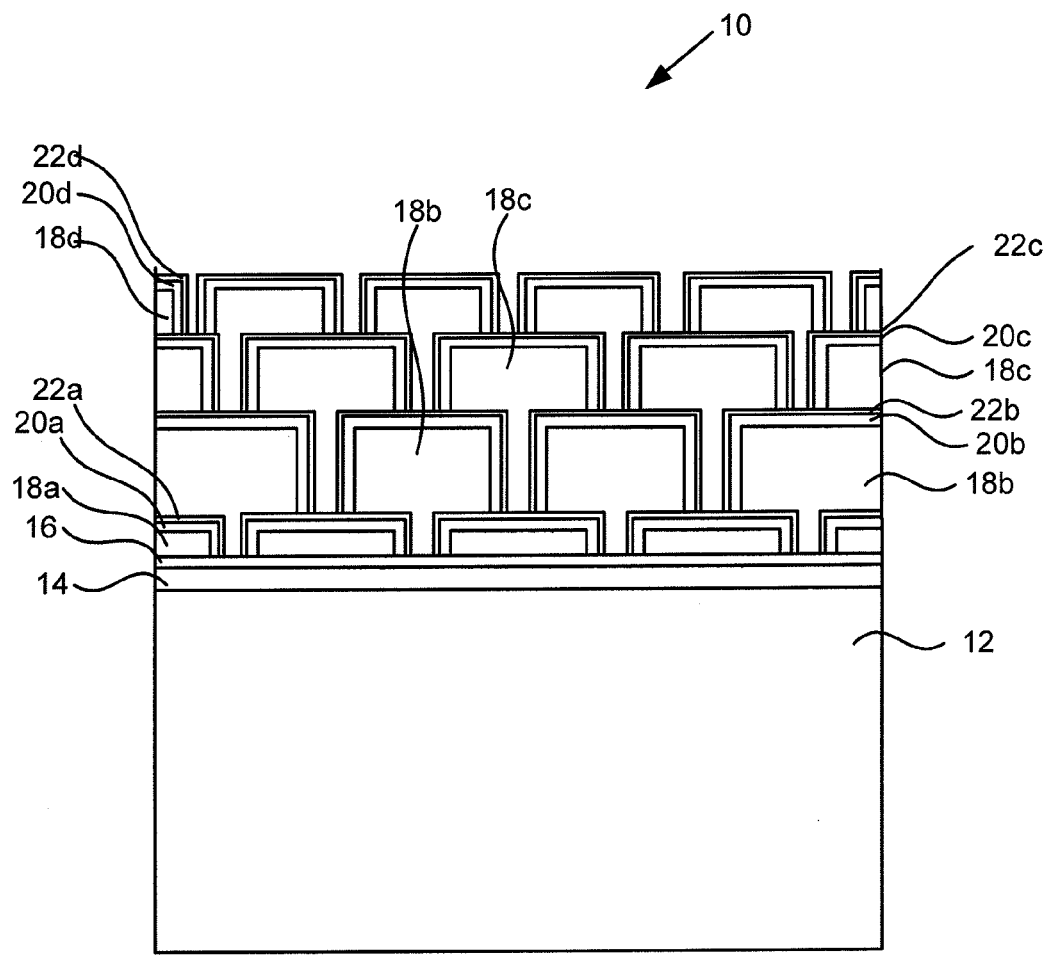
Figure 2:
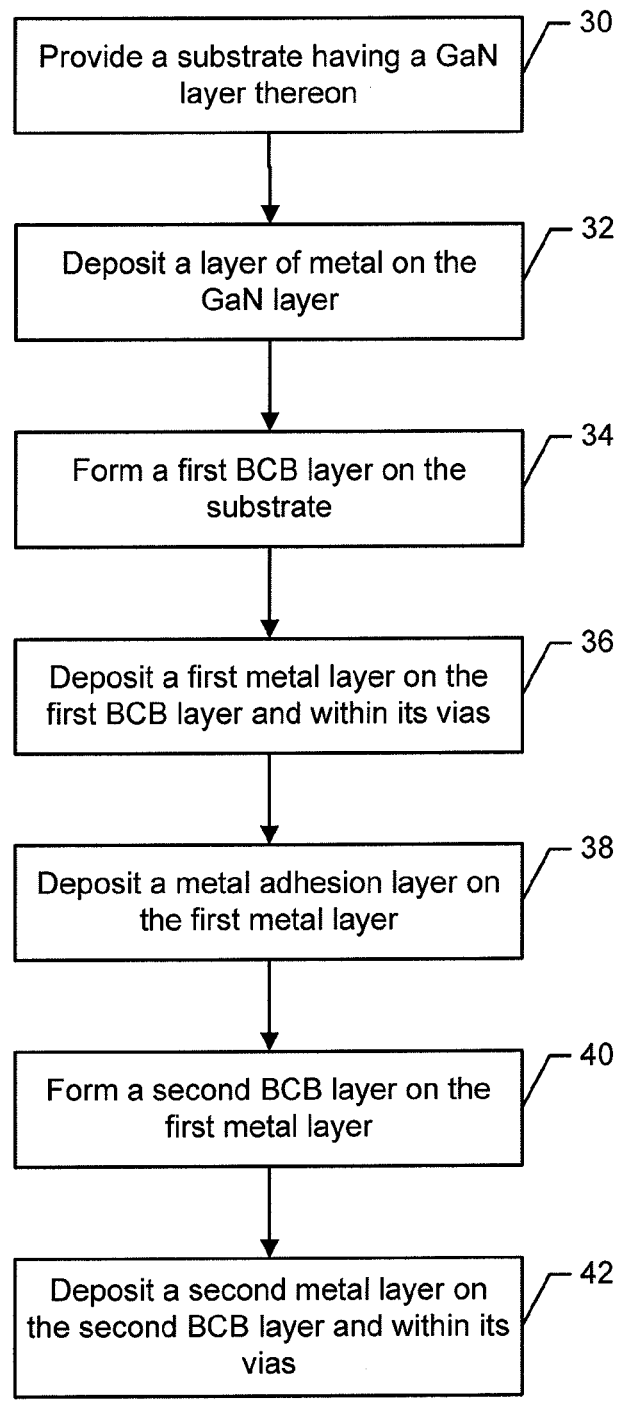
Figure 3:
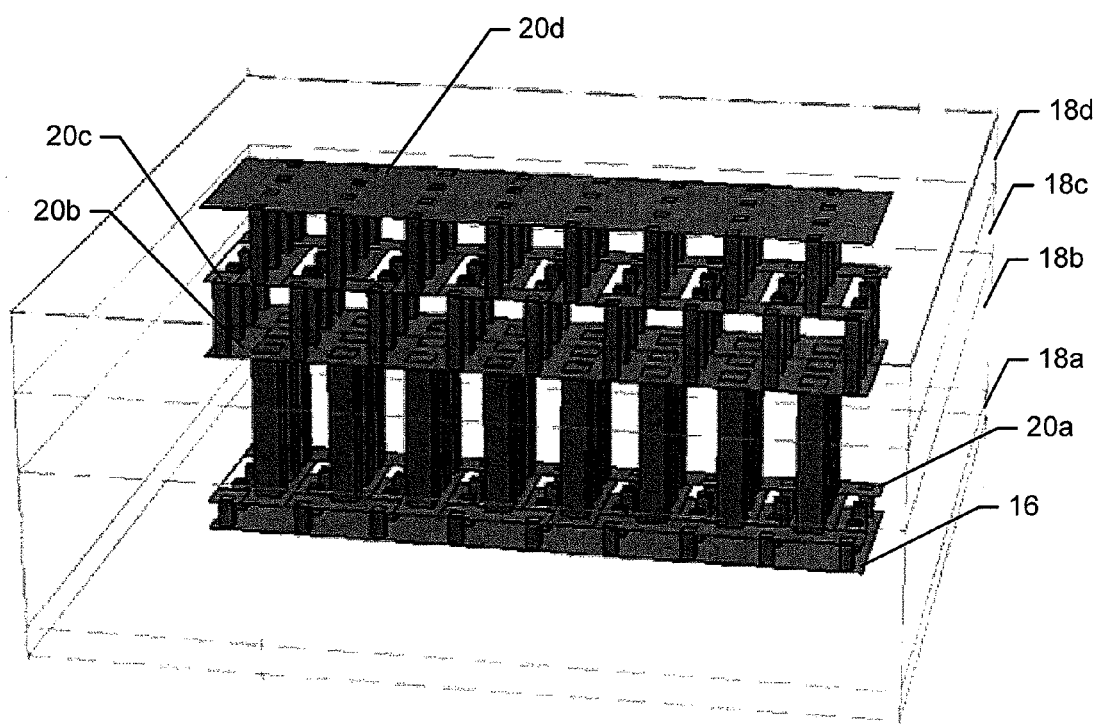
Figure 4:
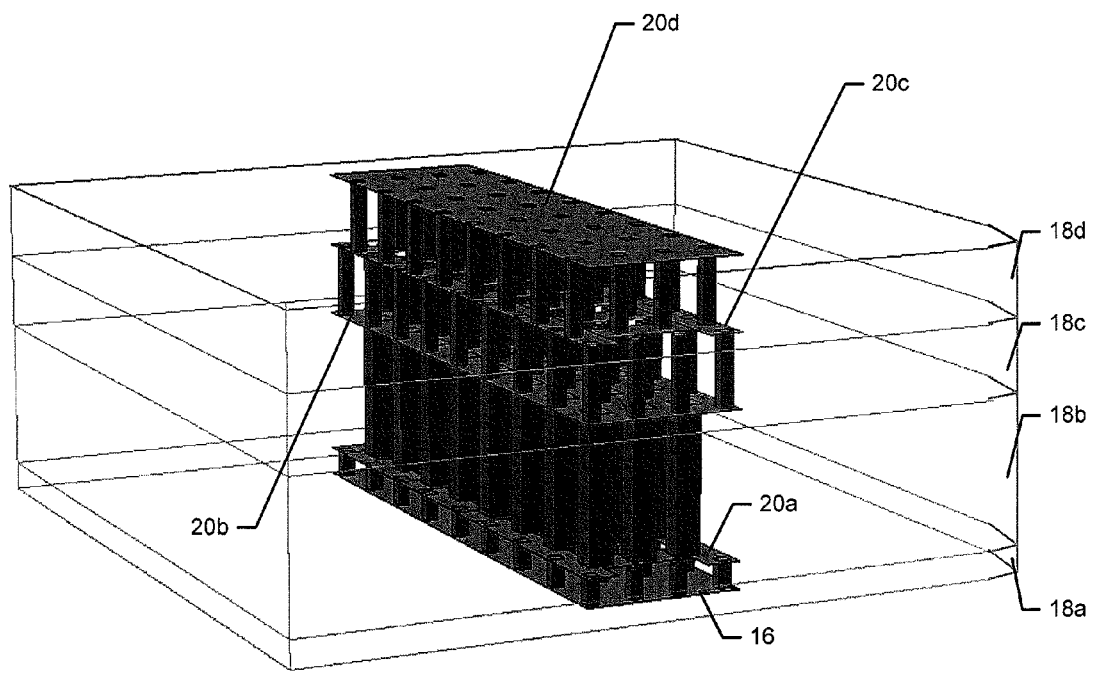
Figure 5:
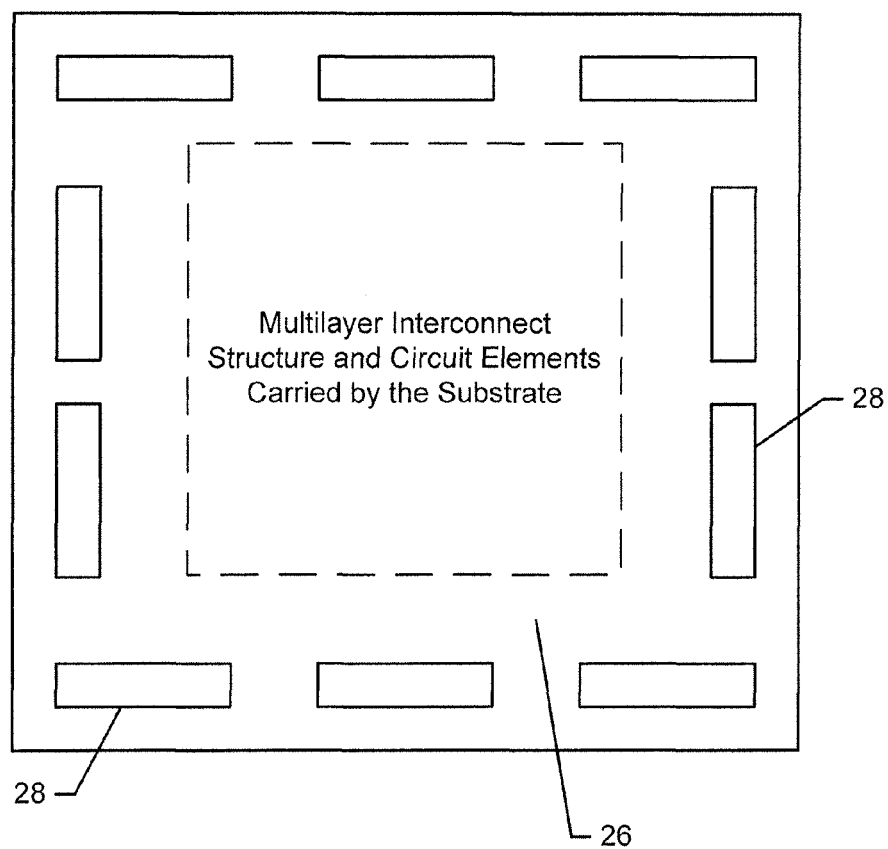

Having thus described example embodiments of the present disclosure in general terms, reference will now be made to the accompanying drawings, which are not necessarily drawn to scale, and wherein:

FIG. 1 is a side view of a device in accordance with one embodiment on the present disclosure;

FIG. 2 is a flow chart of the operations performed in accordance with one embodiment of the present disclosure;

FIG. 3 is a perspective view of a plurality of metal layers in relation to a plurality of BCB layers in accordance with one embodiment of the present disclosure;

FIG. 4 is a perspective view of the plurality of metal layers in association with the plurality of BCB layers of FIG. 3 when taken from a different vantage point; and FIG. 5 is a plan view of a die including a device in accordance with one embodiment of the present disclosure, which illustrates the peripheral placement of the metal layers and the BCB layers.

DETAILED DESCRIPTION

The present disclosure now will be described more fully hereinafter with reference to the accompanying drawings, in which some, but not all embodiments are shown. Indeed, this disclosure may be embodied in many different forms and should not be construed as limited to the embodiments set forth herein; rather, these embodiments are provided so that this disclosure will satisfy applicable legal requirements. Like numbers refer to like elements throughout.

Referring now to FIG. 1, a device 10 in accordance with one embodiment of the present disclosure is depicted. Although a variety of devices may be fabricated in accordance with embodiments of the present disclosure, a least some of the devices may be designed for high frequency applications including, but not limited to, applications involving signals having frequencies in the microwave and/or millimeter ranges including, for example, active electronically scanned antennas (AESAs) and other MMIC devices.

As shown in FIG. 1, the device 10 may include a substrate 12. While the device 10 may include a variety of substrates 12, the substrate of one embodiment may be formed as silicon carbide (SiC). The device 10 may also include an epitaxial semiconductor layer 14 formed on the substrate 12 for defining one or more circuit elements of the device, such as one or more transistors that define the functionality of the device. The semiconductor layer 14 of one embodiment is formed of a III-V material such as gallium nitrate (GaN) that defines a plurality of transistors that, in turn, define the functionality of the device 10. As such, a method of fabricating the device 10 in accordance with one embodiment of the present disclosure may include the provision of a substrate having a GaN layer 14 formed thereon, as shown in operation 30 of FIG. 2.

Although not shown in FIG. 1, the device 10 may include a multi-layer interconnect structure that includes a plurality of metal layers that define, for example, both horizontal and vertical interconnects formed, for example, of gold and a plurality of dielectric layers, such as a plurality of BCB layers, that separate the metal layers. The multi-layer interconnect structure electrically connects the circuit elements defined by the epitaxial semiconductor layer 14 and carried by the substrate 12 to one another and/or to offboard electrical components. In order to avoid or at least reduce the likelihood of delamination of the BCB layers, the device 10 may also include a stacked structure that is described below and that serves to secure the BCB layers to the underling structure in a manner that reduces the likelihood of their delamination.

In this regard, the device 10 may include a plurality of BCB layers including a first BCB layer 18a that is formed on the substrate 12, such as by spin coating, as shown in operation 34 of FIG. 2. Reference herein to a layer, such as the first BCB layer 18a, being on or disposed on another layer does not necessarily mean that the layers are positioned immediately adjacent one another so as to be in physical contact. Instead, a first layer may be considered to be on a second layer so long as one layer overlies the other layer even if there are one or more intermediate or intervening layers positioned between the first and second layers. In the illustrated embodiment, for example, a semiconductor layer, such as a GaN layer 14, may be formed on the substrate 12 as described above and the first BCB layer 18a may be formed on the GaN layer. In order to promote adhesion of the first BCB layer 18a to the GaN layer 14, a layer of metal 16 may also be deposited upon the GaN layer, such as a layer of nickel, titanium or aluminum, and the first BCB layer may, in turn, be formed on the layer of metal. See operations 32 and 34 of FIG. 2.

As shown in FIG. 1, the first BCB layer 18a defines a plurality of vias therethrough. In this regard, the plurality of vias defined by the first BCB layer 18a extend through the entire thickness of the first BCB layer. These vias defined by the first BCB layer are different from other vias that are defined for purposes of establishing electrical connection between different layers.

The device 10 also includes a first metal layer 20a formed on the first BCB layer 18a and within the plurality of vias defined by the first BCB layer, such as by sputtering. In one embodiment, the first metal layer 20a may fill the vias defined by the first BCB layer 18a. In the illustrated embodiment, however, the first metal layer 20a plates the vias defined by the first BCB layer 18a, but does not fill the vias. While the first metal layer 20a may be formed of various metals, the first metal layer of one embodiment is formed of gold. As shown, the first metal layer 20a extends through the vias, such as a plating along the walls that define the vias, so as to establish an operable connection with an underlying layer. In the embodiment in which a layer of metal 16 is formed on the semiconductor layer, such as on the GaN layer 14, the first metal layer 20a may establish an operable connection with the layer of metal.

As a result of this operable connection, the first metal layer 20a effectively secures the first BCB layer 18a to the underlying structure. Indeed, the first metal layer 20a may serve as a staple with downwardly extending leg portions defined by the plating through the vias defined by the first BCB layer 18a and a connector portion overlying the first BCB layer and interconnecting the downwardly extending leg portions. Since the distal ends of the downwardly extending leg portions of this embodiment are operably connected with the underlying structure, such as a layer of metal 16, the first metal layer 20a effectively staples the first BCB layer 18a to the underlying structure.

The first metal layer 20a may be formed concurrent with a metal layer of the interconnect structure that is also formed upon the first BCB layer 18a. However, the first metal layer 20a is independent of, i.e., without, an electrical connection to the interconnect structure and independent of an electrical connection to any circuit element carried by the substrate 12 as well as to any electrical component offboard of the substrate. Thus, the first metal layer 20a is electrically isolated from the interconnect structure, from any circuit element carried by the substrate 12 as well as from any electrical component offboard of the substrate.

A second BCB layer 18b may then be formed on the first metal layer 20a, as shown in operation 40 of FIG. 2. While the second BCB layer 18b may be formed directly upon the first metal layer 20a, the device 10 of one embodiment includes a metal adhesion layer 22a deposited on the first metal layer 20a, such as a metal adhesion layer formed of aluminum (Al), nickel (Ni), copper (Cu) or other metals, that is electroplated onto the first metal layer. See operation 38 of FIG. 2. In this embodiment, the second BCB layer 18b may be formed on the metal adhesion layer 22a so as to be more securely adhered to the underlying metal layer 20a and, in turn, the underlying structure. The second BCB layer 18b also defines a plurality of vias therethrough. In one embodiment, the plurality of vias defined by the second BCB layer 18b are offset, such as in a width-wise or lateral direction, e.g., a horizontal direction in the orientation of the device 10 shown in FIG. 1, from the vias defined by the first BCB layer 18a.

The device 10 of one embodiment also includes a second metal layer 20b deposited on the second BCB layer 18b and within the plurality of vias defined by the second metal layer. See operation 42 of FIG. 2. In one embodiment, the second metal layer 20b may fill the vias defined by the second BCB layer 18b. In the illustrated embodiment, however, the second metal layer 20b plates the vias defined by the second BCB layer 18b, but does not fill the vias. While the second metal layer 20b may be formed of various metals, the first and second metal layers of one embodiment are formed of the same metal, such as gold. As a result of the extension of the second metal layer 20b through the vias defined by the second BCB layer 18b, the second metal layer may establish an operable connection with the first metal layer 20a. In one embodiment, the second metal layer 20b may establish a direct connection with the first metal layer 20a. However, in other embodiments in which a metal adhesion layer 22a is deposited upon the first metal layer 20a, the second metal layer 20b may make a direct connection with the metal adhesion layer and, in turn, an operable connection with the underlying first metal layer. In either instance, the second metal layer 20b may serve to secure the second BCB layer 18b to the underlying structure so as to reduce the likelihood of the delamination of the second BCB layer. Indeed, as described above in conjunction with the first metal layer 20a, the second metal layer 20b may serve to effectively staple the second BCB layer 18b to the underlying structure.

The second metal layer 20b may be formed concurrent with a metal layer of the interconnect structure that is also formed upon the second BCB layer 18b. However, the second metal layer 20b is independent of, i.e., without, an electrical connection to the interconnect structure and independent of an electrical connection to any circuit element carried by the substrate 12 as well as to any electrical component offboard of the substrate. Thus, the second metal layer 20b is electrically isolated from the interconnect structure, from any circuit element carried by the substrate 12 as well as from any electrical component offboard of the substrate.

In embodiments in which the multilayer interconnect structure includes three or more BCB layers as dielectric layers between the interconnects, the device 10 may include an alternating sequence of BCB layers and metal layers with the metal layers coated, in some embodiments, with a metal adhesion layer. In the embodiment illustrated in FIG. 1, for example, the device 10 includes a stack of metal plated vias that includes four BCB layers 18a, 18b, 18c, 18d with a metal layer 20a, 20b, 20c, 20d and a metal adhesion layer 22a, 22b, 22c, 22d on each respective BCB layer. In this embodiment, the meal layer that overlies an underlying BCB layer may not only overlie the BCB layer, but may extend through vias defined by the underlying BCB layer so as to establish an operable connection with an underlying metal layer, thereby effectively securing the respective BCB layer to the underlying structure and reducing the likelihood of delamination of the BCB layer.

By way of example, a portion of a device 10 including five metal layers 16, 20a, 20b, 20c, 20d and four BCB layers 18a, 18b, 18c, 18d is shown in FIGS. 3 and 4. In this regard, the first BCB layer 18a is sandwiched between the layer of metal 16 and the first metal layer 20a, the second BCB layer 18b is disposed between the first metal layer 20a and the second metal layer 20b, the third BCB layer 18c is positioned between the second metal layer 20b and the third metal layer 20c, and the fourth BCB layer 18d is disposed between the third metal layer 20c and the fourth metal layer 20d. As will be recognized, the BCB layers may have different thicknesses such that the downwardly extending portions of the metal layers that extend through the vias defined by the respective BCB layers may, in turn, have different lengths. For example, the downwardly extending portions of the second metal layer 18b are longer than the downwardly extending portions of the first metal layer 18a as a result of the second BCB layer 18b being thicker than the first BCB layer 18a. By operably connecting an overlying metal layer to an underlying metal layer, the intervening BCB layer may be secured to the underlying structure such that the likelihood of delamination of the respective BCB layer is reduced.

The stacks 28 of metal-plated vias (one of which is shown, for example, in FIGS. 3 and 4) may be formed in any portion of the die 26 that does not include electrical interconnects and circuit elements, that is, the stacks 28 of metal-plated vias may be formed in any empty space of the die. As shown in the plan view of FIG. 5, for example, the stacks 28 of metal-plated vias may be formed proximate an edge of a die 26 that includes the device 10. By forming the stacks 28 of metal plated vias proximate the edge of the die 26, the stacks of metal-plated vias may reduce the likelihood that the BCB layers will delaminate since such delamination generally begins from an edge of the die, such as a result of the intrusion of a solvent between the BCB layer and an adjacent layer. By forming the stacks 28 of metal-plated vias proximate only the edge of the die 26 in accordance with one embodiment, the central portion of the die of one embodiment is free of the stacks of metal-plated vias such that the multilayer interconnect structure to the underlying semiconductor layer may be formed in the central portion of the die in a conventional manner. As such, the metal layers 20a, 20b, 20c, 20d of the stacks 28 of metal-plated vias are electrically independent and distinct from the metal interconnects of the multilayer interconnect structure and from the circuit elements carried by the substrate 12. However, the metal layers 20a, 20b, 20c, 20d serve to secure the BCB layers 18a, 18b, 18c, 18d that serve as the dielectric layers between the metal interconnects of the multilayer interconnect structure to the underlying structure in order to reduce the likelihood of the delamination of the BCB layers.

Many modifications and other embodiments of the disclosure set forth herein will come to mind to one skilled in the art to which these embodiments pertain having the benefit of the teachings presented in the foregoing descriptions and the associated drawings. Therefore, it is to be understood that the disclosure is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A method of integrating a plurality of benzocyclobutene (BCB) layers with a substrate, the method comprising:
   forming a first BCB layer on the substrate, wherein the first BCB layer defines a plurality of vias therethrough to expose an underlying structure;
   depositing a first metal layer on the first BCB layer and within the plurality of vias defined by the first BCB layer, wherein the first metal layer includes leg portions extending through a pair of vias to directly connect to the underlying structure and a connector portion extending between the leg portions and continuously across the first BCB layer;
   forming a second BCB layer on the first metal layer that fills the vias defined by the first BCB layer and directly connects to the underlying structure exposed by the vias defined by the first BCB layer, wherein the second BCB layer defines a plurality of vias therethrough; and
   depositing a second metal layer on the second BCB layer and within the plurality of vias defined by the second BCB layer such that the second metal layer extends through the vias defined by the second BCB layer to establish an operable connection with the first metal layer,
   wherein the first and second metal layers are independent of an electrical connection to any transistor carried by the substrate.

2. A method according to claim 1 further comprising providing the substrate having a layer of gallium nitride (GaN) thereon.

3. A method according to claim 2 further comprising depositing a layer of metal on the GaN layer, wherein forming the first BCB layer comprises forming the first BCB layer on the layer of metal, and wherein depositing the first metal layer comprises establishing an operable connection with the layer of metal.

4. A method according to claim 1 further comprising depositing a metal adhesion layer on the first metal layer prior to forming the second BCB layer.

5. A method according to claim 1 wherein forming the first and second BCB layers and depositing the first and second metal layers comprise forming the first and second BCB layers and depositing the first and second metal layers proximate an edge of a die.

6. A method according to claim 1 further comprising forming a metallic interconnect concurrent with formation of at least one of the first metal layer and the second metal layer, wherein the metallic interconnect is configured to establish an electrical connect with a transistor carried by the substrate but is independent of an electrical connection with the first and second metal layers.

7. A method according to claim 1 wherein forming the second BCB layer comprises defining the vias through the second BCB layer to be offset from the vias of the first BCB layer.

8. A method of integrating a plurality of benzocyclobutene (BCB) layers with a substrate, the method comprising:
providing the substrate having a layer of gallium nitride (GaN) thereon;
forming a first BCB layer on the GaN layer, wherein the first BCB layer defines a plurality of vias therethrough to expose an underlying structure;
depositing a first metal layer on the first BCB layer and within the plurality of vias defined by the first BCB layer, wherein the first metal layer includes leg portions extending through a pair of vias to directly connect to the underlying structure and a connector portion extending between the leg portions and continuously across the first BCB layer;
depositing a metal adhesion layer on the first metal layer;
forming a second BCB layer on the metal adhesion layer that fills the vias defined by the first BCB layer and directly connects to the underlying structure exposed by the vias defined by the first BCB layer, wherein the second BCB layer defines a plurality of vias therethrough; and
depositing a second metal layer on the second BCB layer and within the plurality of vias defined by the second BCB layer,
wherein the first and second metal layers are independent of an electrical connection to any transistor carried by the substrate.

9. A method according to claim 8 further comprising depositing a layer of metal on the GaN layer, wherein forming the first BCB layer comprises forming the first BCB layer on the layer of metal, and wherein depositing the first metal layer comprises establishing an operable connection with the layer of metal.

10. A method according to claim 8 wherein depositing the first metal layer comprises depositing a first metal layer comprised of gold.

11. A method according to claim 8 wherein forming the first and second BCB layers and depositing the first and second metal layers comprise forming the first and second BCB layers and depositing the first and second metal layers proximate an edge of a die.

12. A method according to claim 8 further comprising forming a metallic interconnect concurrent with formation of at least one of the first metal layer and the second metal layer, wherein the metallic interconnect is configured to establish an electrical connect with a transistor carried by the substrate but is independent of an electrical connection with the first and second metal layers.

13. A method according to claim 8 wherein forming the second BCB layer comprises defining the vias through the second BCB layer to be offset from the vias of the first BCB layer.

14. A device comprising:
a substrate;
a plurality of benzocyclobutane (BCB) layers including a first BCB layer on the substrate, wherein the first BCB layer defines a plurality of vias therethrough to expose an underlying structure;
a first metal layer on the first BCB layer and within the plurality of vias defined by the first BCB layer, wherein the first metal layer includes leg portions extending through a pair of vias to directly connect to the underlying structure and a connector portion extending between the leg portions and continuously across the first BCB layer;
wherein the plurality of BCB layers further include a second BCB layer on the first metal layer that fills the vias defined by the first BCB layer and directly connects to the underlying structure exposed by the vias defined by the first BCB layer, wherein the second BCB layer defines a plurality of vias therethrough; and
a second metal layer on the second BCB layer and within the plurality of vias defined by the second BCB layer such that the second metal layer extends through the vias defined by the second BCB layer to establish an operable connection with the first metal layer,
wherein the first and second metal layers are independent of an electrical connection to any transistor carried by the substrate.

15. A device according to claim 14 further comprising a layer of gallium nitride (GaN) on the substrate, wherein the first BCB layer is on the GaN layer.

16. A device according to claim 15 further comprising a layer of metal on the GaN layer, wherein the first BCB layer is on the layer of metal, and wherein the first metal layer establishes an operable connection with the layer of metal.

17. A device according to claim 14 further comprising a metal adhesion layer on the first metal layer, wherein the second BCB layer is on the metal adhesion layer.

18. A device according to claim 14 wherein the device comprises a die, and wherein the first and second BCB layers and the first and second metal layers are proximate an edge of the die.

19. A device according to claim 14 further comprising a metallic interconnect formed concurrent with at least one of the first metal layer and the second metal layer, wherein the metallic interconnect is configured to establish an electrical connect with a transistor carried by the substrate but is independent of an electrical connection with the first and second metal layers.

20. A device according to claim 14 wherein the vias of the second BCB layer are offset from the vias of the first BCB layer.

* * * * *